(12) United States Patent
Chen et al.

(10) Patent No.: US 12,148,656 B2
(45) Date of Patent: Nov. 19, 2024

(54) METHOD OF MANUFACTURING SEMICONDUCTOR DEVICE AND SEMICONDUCTOR DEVICES

(71) Applicant: TAIWAN SEMICONDUCTOR MANUFACTURING COMPANY, LTD., Hsinchu (TW)

(72) Inventors: Hsiao-Min Chen, Hsinchu (TW); Jyh-Nan Lin, Hsinchu (TW); Kai-Shiung Hsu, Hsinchu (TW); Ding-I Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 270 days.

(21) Appl. No.: 17/735,090

(22) Filed: May 2, 2022

(65) Prior Publication Data
US 2022/0262677 A1    Aug. 18, 2022

Related U.S. Application Data

(62) Division of application No. 16/664,317, filed on Oct. 25, 2019, now Pat. No. 11,322,397.

(60) Provisional application No. 62/753,039, filed on Oct. 30, 2018.

(51) Int. Cl.
*H01L 21/768* (2006.01)
*H01L 21/02* (2006.01)

(52) U.S. Cl.
CPC .... *H01L 21/76832* (2013.01); *H01L 21/0214* (2013.01); *H01L 21/02164* (2013.01); *H01L 21/0217* (2013.01); *H01L 21/02178* (2013.01); *H01L 21/0234* (2013.01)

(58) Field of Classification Search
CPC ........... H01L 21/76832; H01L 21/0214; H01L 21/02164; H01L 21/0217; H01L 21/02178; H01L 21/0234
See application file for complete search history.

(56) References Cited

U.S. PATENT DOCUMENTS

| 9,437,484 B2 | 9/2016 | JangJian et al. |
| 9,728,498 B2 | 8/2017 | Su et al. |
| 2002/0140103 A1* | 10/2002 | Kloster ............... H01L 23/5226 257/E23.161 |

(Continued)

FOREIGN PATENT DOCUMENTS

| CN | 105529321 A | 4/2016 |
| CN | 106328602 A | 1/2017 |

(Continued)

OTHER PUBLICATIONS

Non-Final Office Action issued in U.S. Appl. No. 16/664,317 dated Jan. 19, 2021.
(Continued)

*Primary Examiner* — Nathan W Ha
(74) *Attorney, Agent, or Firm* — STUDEBAKER & BRACKETT PC

(57) ABSTRACT

In a method of manufacturing a semiconductor device, a first dielectric layer is formed over a substrate, an adhesion enhancement layer is formed on a surface of the first dielectric layer, and a second dielectric layer is formed on the adhesion enhancement layer.

20 Claims, 12 Drawing Sheets

(56) References Cited

U.S. PATENT DOCUMENTS

| | | | |
|---|---|---|---|
| 2003/0089678 A1* | 5/2003 | Chen | H01L 21/76838 257/E21.582 |
| 2008/0119057 A1 | 5/2008 | Chua et al. | |
| 2008/0150145 A1* | 6/2008 | King | H01L 23/5329 257/762 |
| 2013/0292794 A1* | 11/2013 | Pai | H01L 28/91 257/532 |
| 2015/0348835 A1* | 12/2015 | Deng | H01L 21/76867 438/653 |
| 2016/0071801 A1 | 3/2016 | Lin et al. | |
| 2016/0111325 A1* | 4/2016 | JangJian | H01L 21/76807 257/774 |
| 2016/0133512 A1* | 5/2016 | Lee | H01L 21/76832 438/666 |
| 2016/0372413 A1* | 12/2016 | Mahalingam | H01L 21/76832 |
| 2017/0018458 A1* | 1/2017 | Cheng | H01L 21/02063 |
| 2017/0178954 A1* | 6/2017 | Wu | H01L 23/5226 |
| 2017/0207083 A1* | 7/2017 | Hwang | H01L 21/02318 |
| 2017/0309497 A1* | 10/2017 | Dieny | H10N 70/245 |
| 2017/0309514 A1* | 10/2017 | Rainville | H01L 21/0274 |
| 2017/0317076 A1* | 11/2017 | Shen | H01L 27/0886 |
| 2017/0338192 A1* | 11/2017 | Lee | H01L 21/76834 |
| 2018/0151422 A1* | 5/2018 | Tsai | H01L 21/76804 |
| 2018/0261546 A1* | 9/2018 | Bark | H01L 23/5226 |
| 2018/0308793 A1* | 10/2018 | Lin | H01L 21/0234 |
| 2018/0315648 A1* | 11/2018 | Ke | H01L 21/76811 |
| 2019/0164748 A1* | 5/2019 | Chou | H01L 21/76802 |
| 2019/0333807 A1* | 10/2019 | Tung | H01L 21/7684 |
| 2020/0111865 A1* | 4/2020 | Lu | H01L 21/76834 |

FOREIGN PATENT DOCUMENTS

| | | |
|---|---|---|
| CN | 106356332 A | 1/2017 |
| JP | H08-83786 A | 3/1996 |
| KR | 10-2006-0010917 A | 2/2006 |
| KR | 10-2016-0045550 A | 4/2016 |
| KR | 10-2017-0009686 A | 1/2017 |
| TW | 201618187 A | 5/2016 |

OTHER PUBLICATIONS

Final Office Action issued in U.S. Appl. No. 16/664,317 dated May 24, 2021.

Non-Final Office Action issued in U.S. Appl. No. 16/664,317 dated Sep. 10, 2021.

Notice of Allowance issued in U.S. Appl. No. 16/664,317 dated Dec. 29, 2021.

* cited by examiner

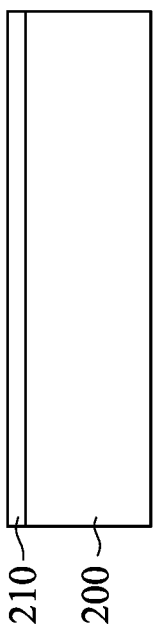
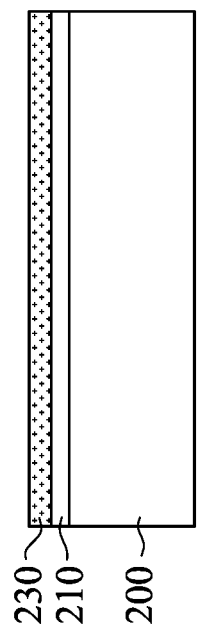
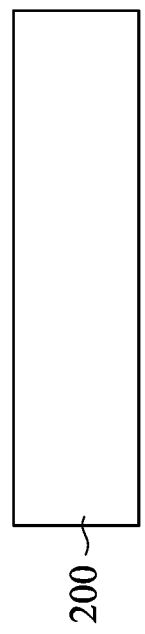

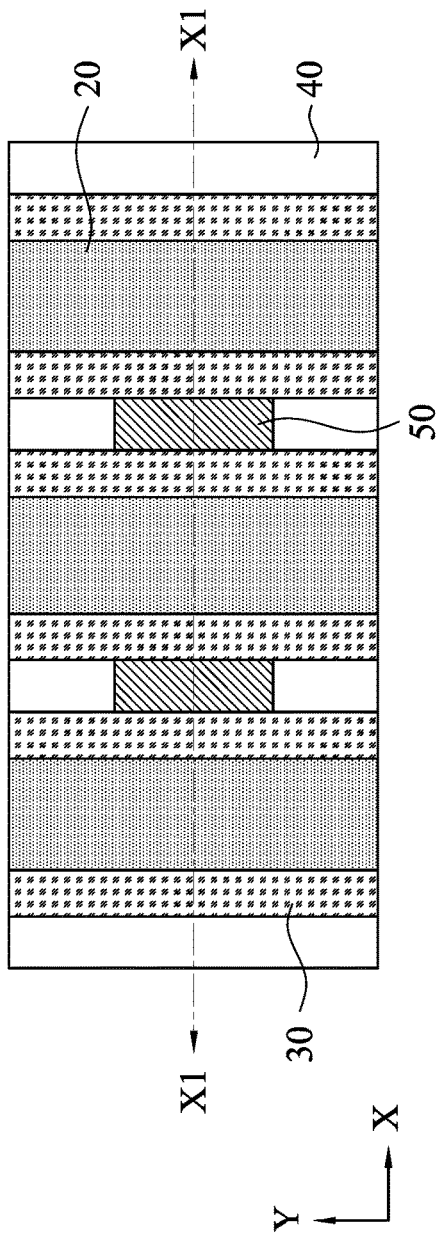
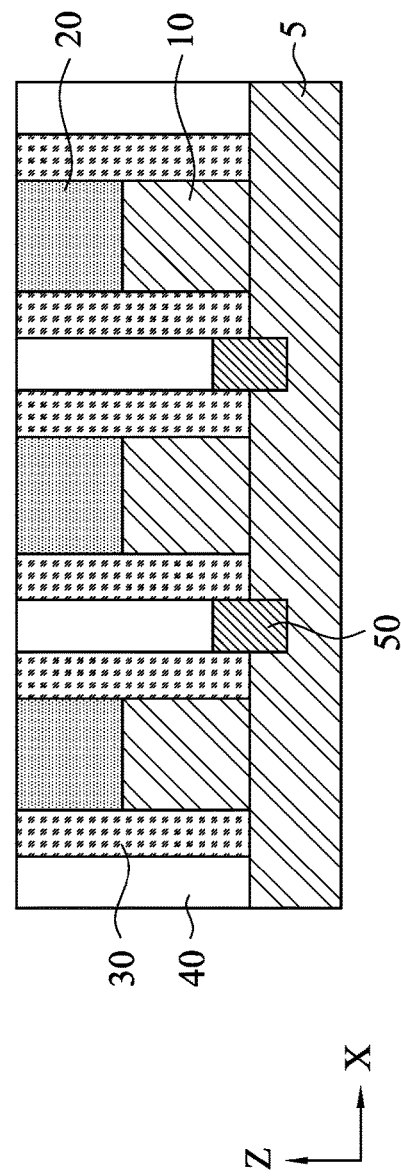
FIG. 4A
FIG. 4B

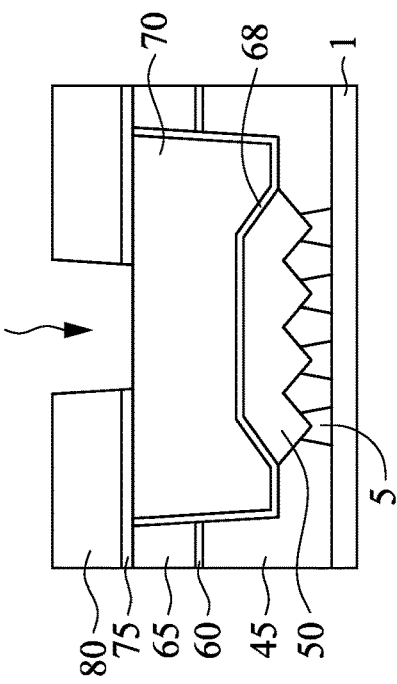
FIG. 5D
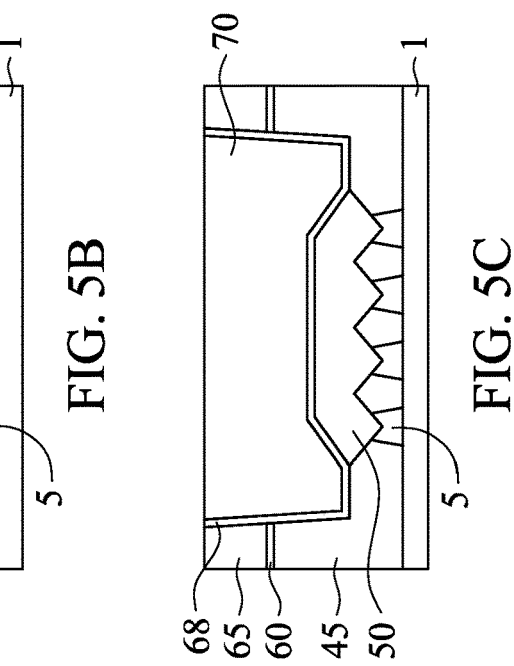
FIG. 5E
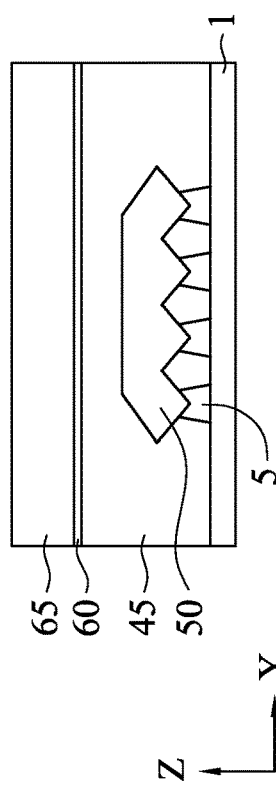
FIG. 5A
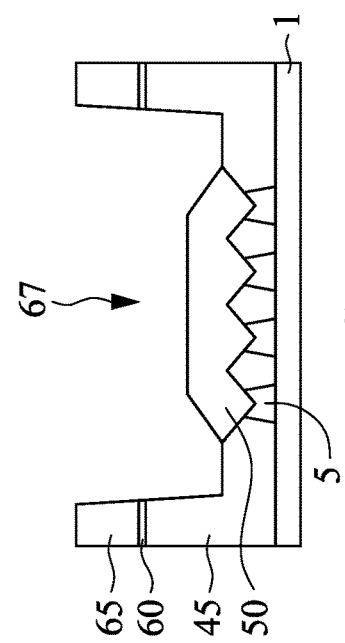
FIG. 5B
FIG. 5C

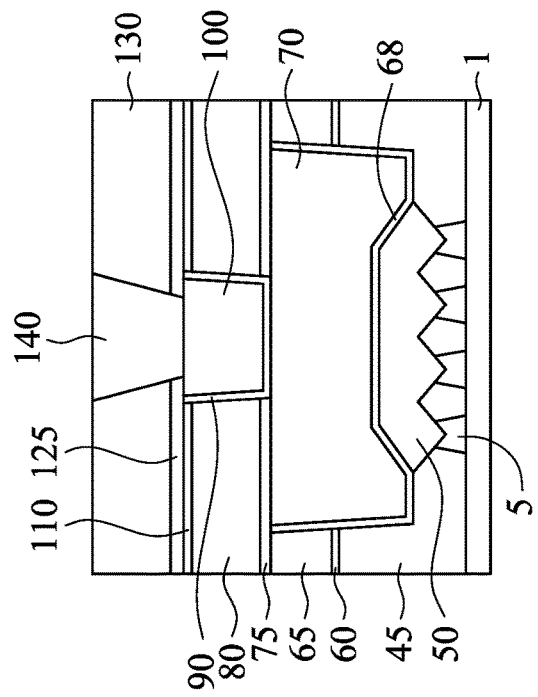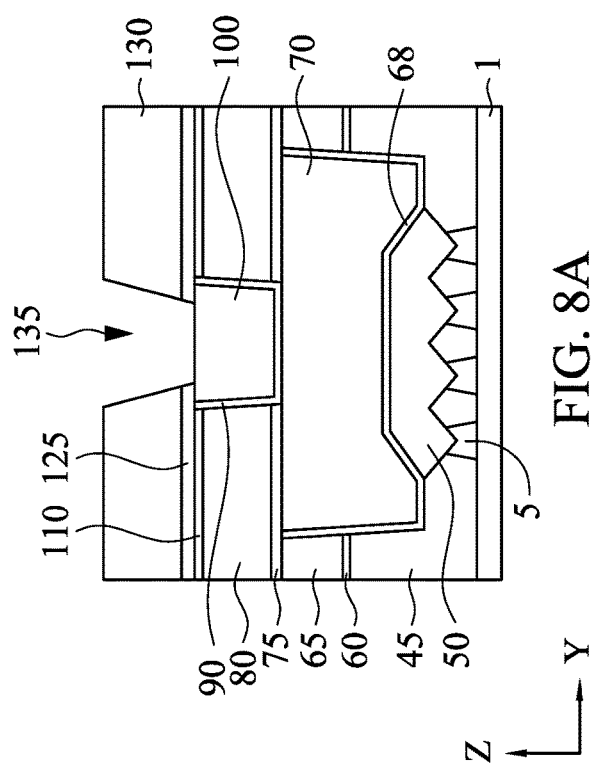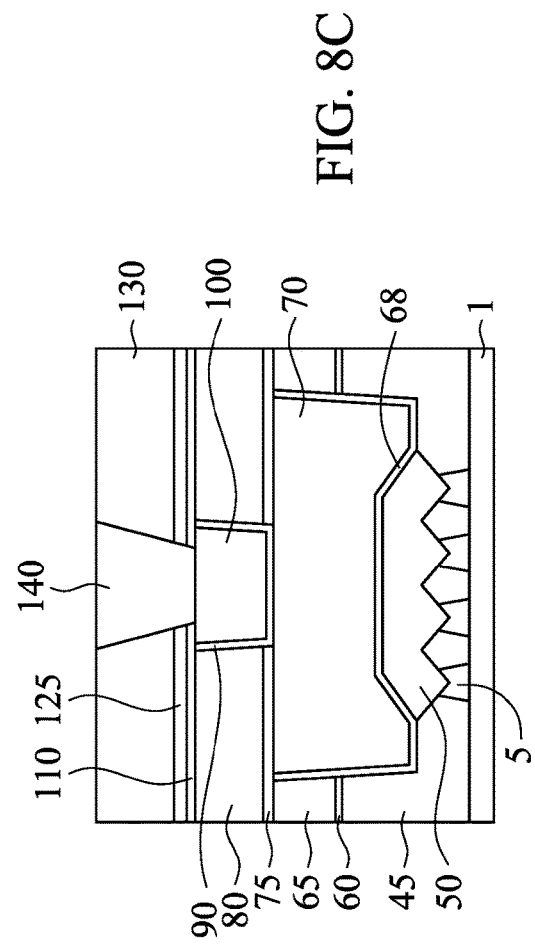

METHOD OF MANUFACTURING SEMICONDUCTOR DEVICE AND SEMICONDUCTOR DEVICES

RELATED APPLICATION

This application is a divisional of U.S. patent application Ser. No. 16/664,317 filed on Oct. 25, 2019, now U.S. Pat. No. 11,322,397, which claims priority of U.S. Provisional Patent Application No. 62/753,039 filed Oct. 30, 2018, the entire contents of each of which are incorporated herein by reference.

BACKGROUND

Peeling is a problem between aluminum nitride layers and silicon nitride contact etch stop layers. One way to address the peeling problem is to increase the thickness of the aluminum nitride layer; however, this increases the overall device thickness and reduces device density. A solution to the aluminum nitride peeling problem is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C and 1D illustrate various stages of a sequential manufacturing operation of a semiconductor device according to the present disclosure.

FIG. 4A shows a plan view (viewed from the above) illustrating one of the various stages of a sequential fabrication process of a semiconductor device according to one embodiment of the present disclosure. FIG. 4B shows a cross sectional view along line X1-X1 of FIG. 4A.

FIGS. 5A, 5B, 5C, 5D and 5E show cross sectional views of various stages of the sequential fabrication process of a semiconductor device according to an embodiment of the present disclosure.

FIGS. 8A, 8B and 8C show cross sectional views of various stages of the sequential fabrication process of a semiconductor device according to an embodiment of the present disclosure.

DETAILED DESCRIPTION

Figure 2B:
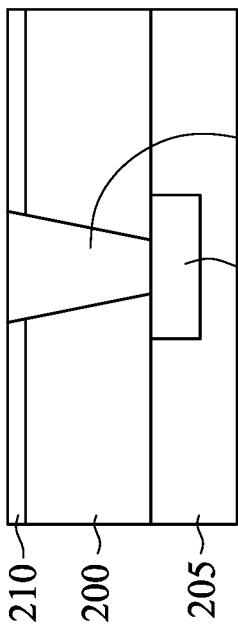
FIGS. 2A, 2B, 2C and 2D illustrate various stages of a sequential manufacturing operation of a semiconductor device according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In a semiconductor device, a metallization layer is formed over a semiconductor device structure. In some embodiments, the semiconductor device structure includes a transistor. In some embodiments, the transistor includes a fin field effect (FinFET) transistor or a gate all around field effect transistor (GAAFET). The metallization layer includes an electrically conductive layer embedded in a dielectric layer. A metallization layer formed over a semiconductor device structure includes an electrically conductive layer, such as tungsten, embedded in an insulating layer, such as silicon nitride, silicon oxynitride or silicon oxide. An etch stop layer, for example, an aluminum based insulating layer (e.g., AlN layer), is formed over the metallization layer. In some embodiments, the electrically conductive layer is a contact that is in contact with the underlying semiconductor device structure. In some embodiments, an aluminum nitride layer is oxidized to form an aluminum oxynitride ($Al_xO_yN_z$) upon exposure the aluminum nitride layer to oxygen in ambient air. The insertion of oxygen atoms in the aluminum nitride lattice due to oxidation causes a loss of adhesion of the aluminum nitride layer to the silicon nitride layer and causes peeling of the aluminum nitride layer from the surface of the silicon nitride. The peeling may cause aluminum oxide hillocks to form. The hillocks are defects and they create an uneven surface of the semiconductor device, thereby reducing semiconductor device yield. The inserted oxygen atom in the lattice disrupts the crystal lattice and creates a strain.

In embodiments of the present disclosure an adhesion enhancement layer (adhesion layer) is formed on the underlying layer (e.g., silicon nitride layer) before forming an etch stop layer (e.g., aluminum nitride layer) to absorb or reduce strain caused in oxidation of the aluminum nitride layer and to suppress peeling of the etch stop layer.

FIGS. 1A, 1B, 1C and 1D illustrate various stages of a sequential manufacturing operation of a semiconductor device according to the present disclosure. It is understood that additional operations can be provided before, during, and after the operations of FIGS. 1A-1D, and some of the operations described below can be replaced or eliminated, for additional embodiments of the method. The order of the operations/processes may be interchangeable.

As shown in FIG. 1, a first dielectric layer 200 is formed over an underlying structure (not shown) on a semiconductor substrate (not shown). In some embodiments, the first dielectric layer 200 includes one or more layers of nitride-based insulating material. In some embodiments, the nitride-based insulating layer is nitride or oxynitride of silicon, germanium, or silicon germanide (SiGe). In some embodiments, the nitride-based insulating material includes silicon nitride and silicon oxynitride. In case of silicon oxynitride, the amount of nitrogen is greater than the amount of oxygen in some embodiments ($Si_xO_yN_z$, where y<z). In certain embodiments, silicon nitride is used as the first dielectric layer 200. The first dielectric layer 200 is formed by chemical vapor deposition (CVD), including low pressure CVD (LPCVD) and plasma enhanced CVD (PECVD), physical vapor deposition (PVD), atomic layer deposition (ALD), or other suitable process.

Then, as shown in FIG. 1B, an adhesion enhancement layer 210 is formed on the surface of the first dielectric layer 200. In some embodiments, the adhesion enhancement layer 210 is an oxygen rich layer having a higher oxygen amount than the first dielectric layer 200. In some embodiments, the adhesion enhancement layer 210 includes silicon oxide. In certain embodiments, the silicon oxide is an oxygen deficient silicon oxide ($SiO_x$, where 0<x<2). In other embodiments, the silicon oxide is silicon dioxide ($SiO_2$). In other embodiments, the adhesion enhancement layer 210 includes oxygen rich silicon oxynitride, $Si_xO_yN_z$, where y>z.

In some embodiments, the adhesion enhancement layer 210 is formed by exposing the first dielectric layer 200 to an oxygen-containing gas under heat (thermal oxidation). In some embodiments, the oxygen-containing gas is at last one selected from oxygen ($O_2$), ozone ($O_3$), a nitrogen oxide ($N_2O$, $NO_2$), and a carbon oxide (CO, $CO_2$). In some embodiments, the nitrogen oxide is nitrous oxide and the carbon oxide is carbon dioxide. In some embodiments, no Si containing gas is included. In some embodiments, the oxygen-containing gas is applied at a pressure of about 0.5 Torr to about 20 Torr. In other embodiments, the oxygen-containing gas is applied at a pressure of about 1.5 Torr to about 8 Torr. In some embodiments, the oxygen treatment is performed at a substrate temperature in a range from about 150° C. to about 500° C. In other embodiments, the substrate temperature is in a range from about 250° C. to about 400° C.

In some embodiments, plasma containing oxygen is used to treat (oxidize) the surface of the first dielectric layer 200.

In other embodiments, the adhesion enhancement layer 210 is a deposition film formed by CVD, PVD, ALD, or other suitable process.

In some embodiments, the adhesion enhancement layer 210 has a thickness in a range from about 0.5 nm to about 10 nm. In other embodiments, the adhesion enhancement layer 210 has a thickness in a range from about 1 nm to about 5 nm. When the thickness of the adhesion enhancement layer 210 is smaller than the lowest value of the ranges, peeling of the adhesion enhancement layer and/or an upper layer subsequently formed on the adhesion enhancement layer may occur. When the thickness of the adhesion enhancement layer 210 is greater than the highest value of the ranges, it may cause a subsequent etching operation.

Further, as shown in FIG. 1C, a second dielectric layer 220 is formed over the adhesion enhancement layer 210. In some embodiments, the second dielectric layer 220 functions as an etch stop layer. The second dielectric layer 220 includes a nitride-based insulating material in some embodiments. In some embodiments, the second dielectric layer 220 includes an aluminum based insulating material. In certain embodiments, the second dielectric layer 220 includes aluminum nitride and/or aluminum oxynitride ($Al_xO_yN_z$). In case of aluminum oxynitride, the amount of nitrogen is greater than the amount of oxygen in some embodiments ($Al_xO_yN_z$, where y<z).

In some embodiments, a thickness of the second dielectric layer 220 is greater than the thickness of the adhesion enhancement layer 210. In some embodiments, the second dielectric layer 220 has a thickness in a range from about 1 nm to about 20 nm. In other embodiments, the second dielectric layer 220 has a thickness in a range from about 2 nm to about 10 nm. In other embodiments, the second dielectric layer 220 is formed by CVD, PVD, ALD, or other suitable process. The aluminum based insulating layer is formed by, for example, metal-organic CVD (MOCVD) or ALD using tri-methyl-aluminum (TMA). In some embodiments, the aluminum nitride layer is crystalline, e.g., wurtzite (2H) AlN.

Subsequently, the second dielectric layer 220 is further oxidized in some embodiments, to form an oxidized second dielectric layer 230 as shown in FIG. 1D. In some embodiments, when the second dielectric layer 220 is made of aluminum nitride, the oxidized second dielectric layer 230 is aluminum oxide or aluminum oxynitride. In some embodiments, a plasma treatment using $O_2$, $CO_2$ and/or CO gases (oxygen containing gas) is performed on the aluminum nitride layer, to at least partially convert the aluminum nitride layer into aluminum oxide. In some embodiments, the concentrations of Al, O and/or N in the plasma treated aluminum nitride layer are not uniform, in particular, along the vertical direction. In some embodiments, the oxidized second dielectric layer 230 includes an aluminum oxide layer (top) and an aluminum oxynitride layer (bottom). In other embodiments, the oxidized second dielectric layer 230 includes an aluminum oxide layer (top), an aluminum oxynitride layer (middle) and an aluminum nitride layer (bottom). In some embodiments, the oxidized second dielectric layer 230 is an aluminum oxide layer. In some embodiments, the aluminum oxide layer is crystalline, such as $\gamma$-$Al_2O_3$ or $\alpha$-$Al_2O_3$. In some embodiments, the oxidized second dielectric layer 230 is oxygen rich aluminum oxynitride, $Al_xO_yN_z$, where y>z. In some embodiments, the oxygen and/or nitrogen concentration is non-uniform in the aluminum oxynitride layer and in certain embodiments, the oxygen concentration decreases from the upper surface toward the bottom surface of the oxidized second dielectric layer 230, while the nitrogen concentration increases from the upper surface toward the bottom surface of the oxidized second dielectric layer 230.

In some embodiments, when the plasma contains carbon, the oxidized second dielectric layer 230 includes AlOC having a non-uniform carbon concentration. In some embodiments, a thermal oxidation process is performed to form the oxidized second dielectric layer 230.

In some embodiments, the oxidized second dielectric layer 220 has a thickness in a range from about 1 nm to about 20 nm. In other embodiments, the oxidized second dielectric layer 220 has a thickness in a range from about 2 nm to about 10 nm.

FIGS. 2A, 2B, 2C and 2D illustrate various stages of a sequential manufacturing operation of a semiconductor device according to the present disclosure. It is understood that additional operations can be provided before, during, and after the operations of FIGS. 2A-2D, and some of the operations described below can be replaced or eliminated, for additional embodiments of the method. The order of the operations/processes may be interchangeable. Materials, configurations, dimensions, processes and/or operations explained with respect to the foregoing embodiments can be employed in the following embodiments, and detailed explanation thereof may be omitted.

Figure 2D:
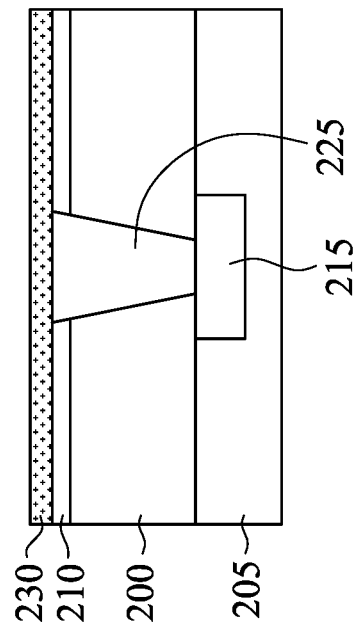
Figure 2A:
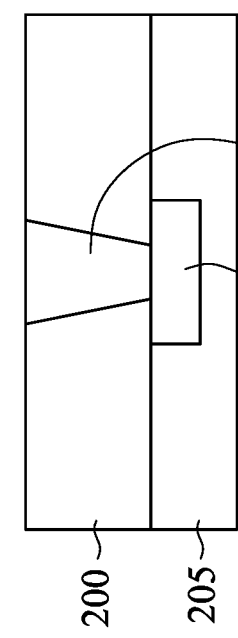

In some embodiments, the first dielectric layer 200 is formed over an underlying layer 205 on which or in which an electronic structure 215 is formed as shown in FIG. 2A. The electronic structure 215 includes a transistor, a wiring, a contact, an interconnect, a via and/or a diffusion region in some embodiments. The underlying layer 205 includes a semiconductor substrate and/or an insulating layer in some embodiments.

Further, as shown in FIG. 2A, a conductive pattern 225 is formed in the first dielectric layer 200 and is in contact with the electronic structure 215 in some embodiments. In some embodiments, the first dielectric layer is made of silicon nitride. The conductive pattern 225 includes a contact, a via, a wire, an interconnect and/or a bar in some embodiments. In some embodiments, an opening is formed in the first dielectric layer 200 by using one or more lithography and etching operations, and the opening is filled with one or more conductive materials by using one or more film formation operations and one or more planarization operations, such as a chemical mechanical polishing (CMP) operation. In some embodiments, the conductive pattern 225 includes polysilicon, aluminum, aluminum-silicon, titanium, titanium silicide, titanium nitride, tungsten, tungsten silicide, molybdenum, molybdenum silicide, copper, platinum, cobalt, cobalt silicide, tantalum, tantalum nitride, indium, gold, and silver or an alloy thereof. In certain embodiments, the conductive pattern 225 includes tungsten. When tungsten is used, one or more glue layers and/or barrier layers (not shown) are formed before a tungsten layer is formed. In some embodiments, the glue and/or barrier layer includes titanium, titanium nitride, tantalum and/or tantalum nitride.

Similar to FIG. 1B, an adhesion enhancement layer 210 is formed at the surface of the first dielectric layer 200 as shown in FIG. 2B. In some embodiments, a thermal or plasma oxidation operation as set forth above is used to form the adhesion enhancement layer 210. In some embodiments, no adhesion enhancement layer is formed on the surface of the conductive pattern 225. In some embodiments, an oxide of an element constituting the conductive pattern 225 is formed at the surface of the conductive pattern 225.

Figure 2C:
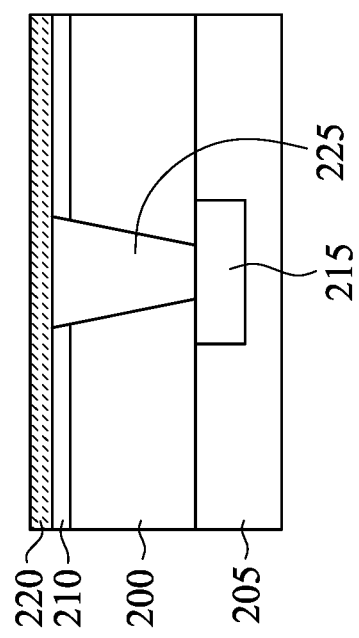

Then, similar to FIG. 1C, a second dielectric layer 220 is formed on the adhesion enhancement layer 210 and the conductive contact 225 as shown in FIG. 2C. In some embodiments, the second dielectric layer is made of aluminum nitride.

Subsequently, similar to FIG. 1D, the second dielectric layer 220 is partially or fully oxidized to form the oxidized second dielectric layer 230 as shown in FIG. 2D.

FIGS. 3A, 3B, 3C and 3D illustrate various stages of a sequential manufacturing operation of a semiconductor device according to the present disclosure. It is understood that additional operations can be provided before, during, and after the operations of FIGS. 3A-3D, and some of the operations described below can be replaced or eliminated, for additional embodiments of the method. The order of the operations/processes may be interchangeable. Materials, configurations, dimensions, processes and/or operations explained with respect to the foregoing embodiments can be employed in the following embodiments, and detailed explanation thereof may be omitted.

Figure 3A:
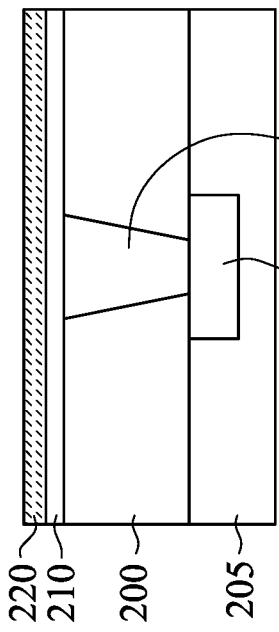
FIGS. 3A, 3B, 3C and 3D illustrate various stages of a sequential manufacturing operation of a semiconductor device according to the present disclosure.

After the structure shown in FIG. 2A is formed, similar to FIG. 1B, an adhesion enhancement layer 210 is formed on the surface of the first dielectric layer 200 and the surface of the conductive pattern 225, as shown in FIG. 3A. In some embodiments, a deposition process, such as CVD, PVD or ALD as set forth above is used to form the adhesion enhancement layer 210.

Figure 3B:
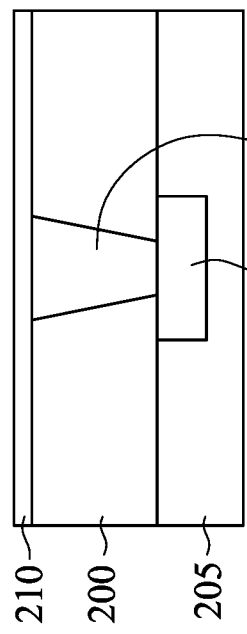

Then, similar to FIG. 1C, a second dielectric layer 220 is formed on the adhesion enhancement layer 210 as shown in FIG. 3B. In some embodiments, the second dielectric layer is made of aluminum nitride.

Figure 3C:
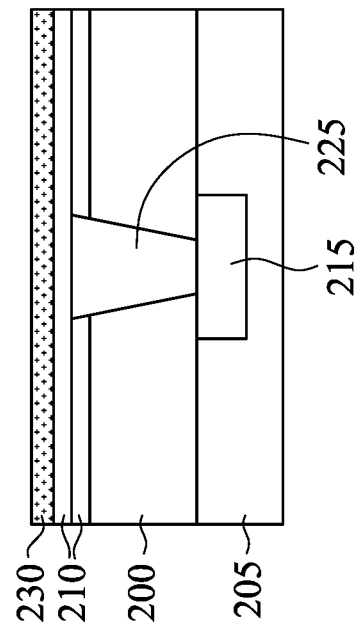
Figure 3D:
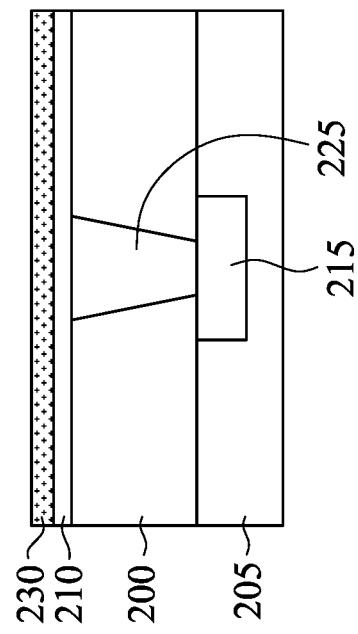

Subsequently, similar to FIG. 1D, the second dielectric layer 220 is partially or fully oxidized to form the oxidized second dielectric layer 230 as shown in FIG. 3C. As shown in FIG. 3C, the oxidized second dielectric layer 230 does not directly contact the conductive pattern 225. In some embodiments, a first adhesion enhancement layer is formed as shown in FIG. 2B, and further a second adhesion enhancement layer is formed over the first adhesion enhancement layer and the conductive pattern 225, as shown in FIG. 3D.

Figure 3E:
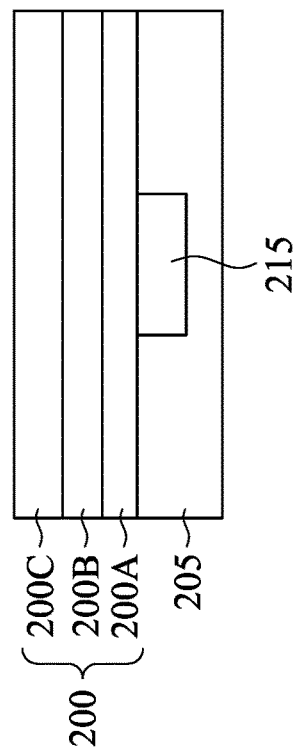
FIGS. 3E, 3F, 3G and 3H illustrate various stages of a sequential manufacturing operation of a semiconductor device according to the present disclosure.
Figure 3F:
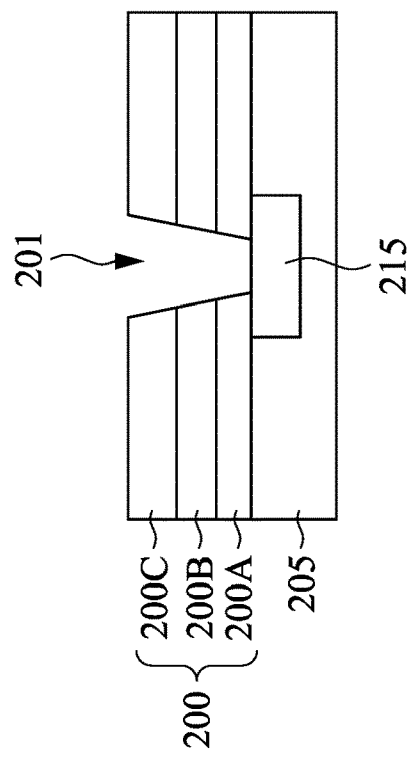
Figure 3G:
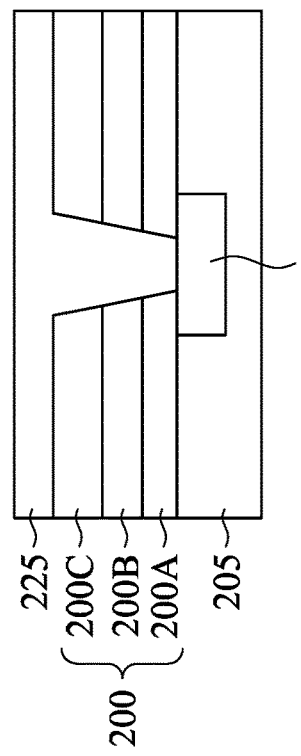
Figure 3H:
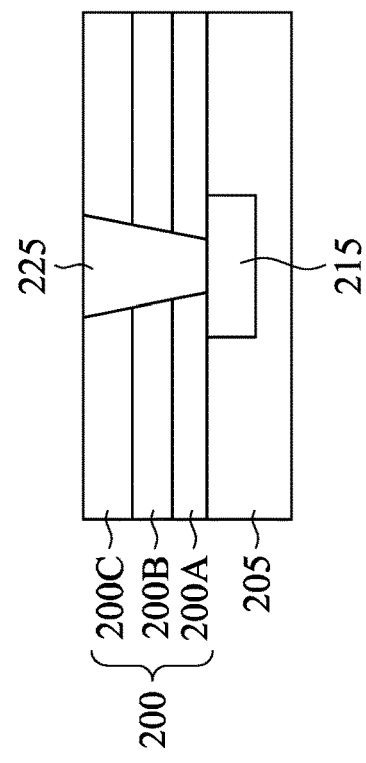

In some embodiments, the first dielectric layer 200 includes multiple dielectric layers. As shown in FIG. 3E, a bottom layer 200A, a middle layer 200B and an upper layer 200C are sequentially formed over the underlying layer 205 and the electronic structure 215. In some embodiments, the bottom layer 200A and the upper layer 200C are made of silicon nitride and the middle layer 200B is made of silicon oxide. Then, an opening 201 is formed over the electronic structure 215 by using one or more lithography and etching operations, as shown in FIG. 3F. Further, a conductive material for the conductive pattern 225 is formed in the opening and on the upper layer 200C, as shown in FIG. 3G. Then, a planarization operation, such as a chemical mechanical polishing (CMP) and/or an etch-back process, is performed to obtain the conductive pattern 225, as shown in FIG. 3H. Subsequently, the operations explained with respect to FIG. 2B-2D or 3A-3D are performed.

FIGS. 4A-8C illustrate various stages of a sequential manufacturing operation of a semiconductor device according to the present disclosure. It is understood that additional operations can be provided before, during, and after the operations of FIGS. 4A-8C, and some of the operations described below can be replaced or eliminated, for additional embodiments of the method. The order of the operations/processes may be interchangeable. Materials, configurations, dimensions, processes and/or operations explained with respect to the foregoing embodiments can be employed in the following embodiments, and detailed explanation thereof may be omitted.

FIGS. 4A and 4B show one of the stages of a sequential fabrication process of a semiconductor device according to one embodiment of the present disclosure. FIG. 4A shows a plan (top) view and FIG. 4B shows a cross sectional view along line X1-X1 of FIG. 4A.

FIGS. 4A and 4B show a structure of a semiconductor device after metal gate structures 10 are formed. In FIGS. 4A and 4B, metal gate structures 10 are formed over a channel layer 5, for example, a part of a fin structure, and cap insulating layers 20 are disposed over the metal gate structures 10. The thickness of the metal gate structures 10 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. Sidewall spacers 30 are provided on sidewalls of metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 8 nm in other embodiments. The combination of the metal gate structure 10, the cap insulating layer 20 and sidewall spacers 30 may be collectively referred to as a gate structure. Further, source/drain regions 50 are formed adjacent to the gate structures, and spaces between the gate structures are filled with an interlayer dielectric (ILD) layer 40.

Figure 4E:
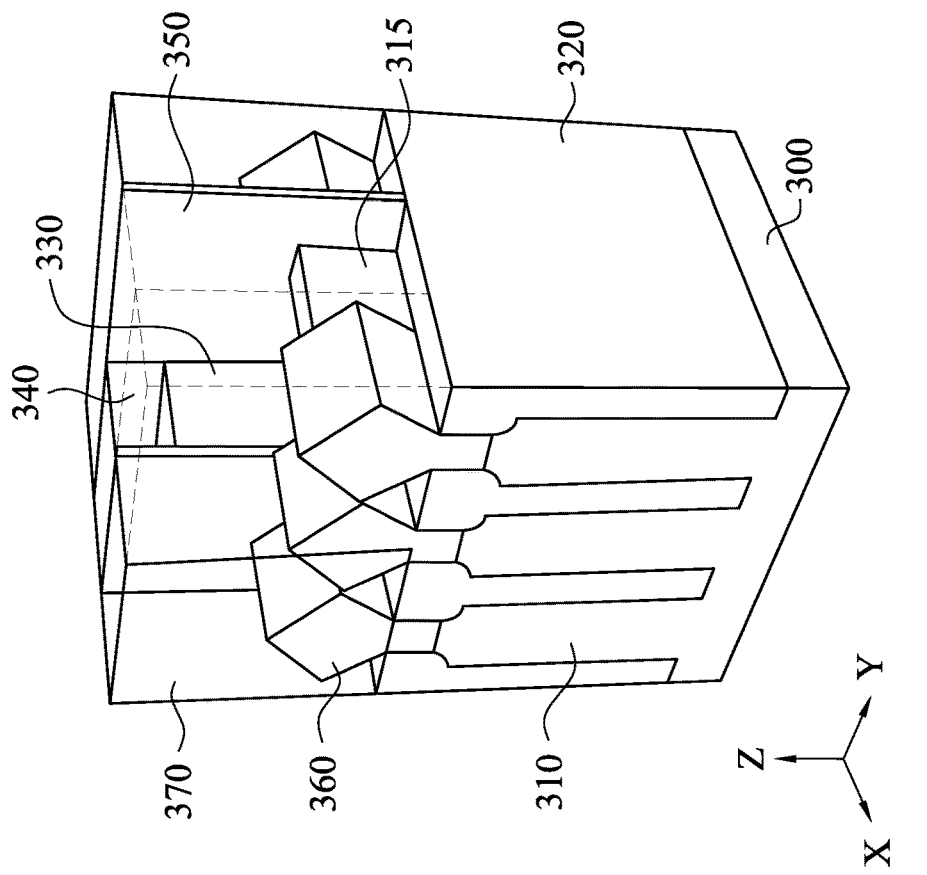
FIG. 4E shows a perspective view illustrating one of the various stages of a sequential fabrication process of a semiconductor device according to one embodiment of the present disclosure.
Figure 4C:
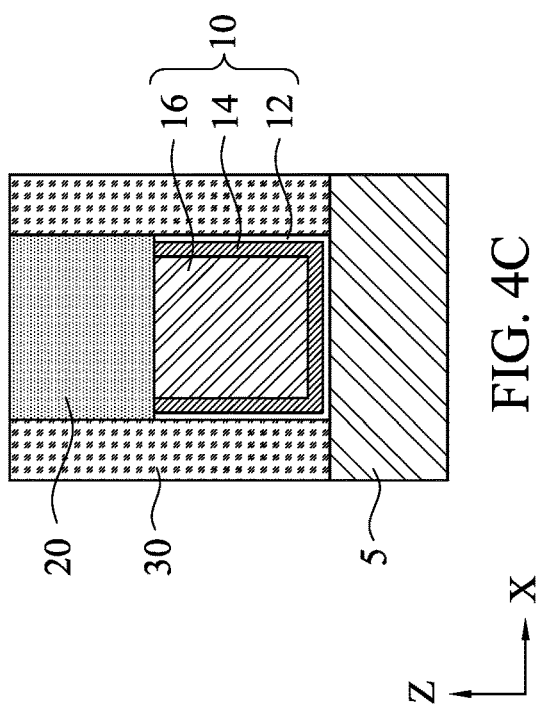
FIGS. 4C and 4D are enlarged views of the gate structure.

FIG. 4C is an enlarged view of the gate structure. The metal gate structure 10 includes one or more layers 16 of metal material, such as Al, Cu, W, Ti, Ta, TiN, TiAl, TiAlC, TiAlN, TaN, NiSi, CoSi, other conductive materials. A gate dielectric layer 12 disposed between the channel layer 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 (MG) are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. The sidewall spacer 30 is made of a different material than the cap insulating layer 20 and includes one or more layers of insulating material such as silicon nitride based material including SiN, SiON, SiCN and SiOCN. The ILD layer 40 includes one or more layers of insulating material such as silicon oxide based material such as silicon dioxide ($SiO_2$) and SiON.

Figure 4D:
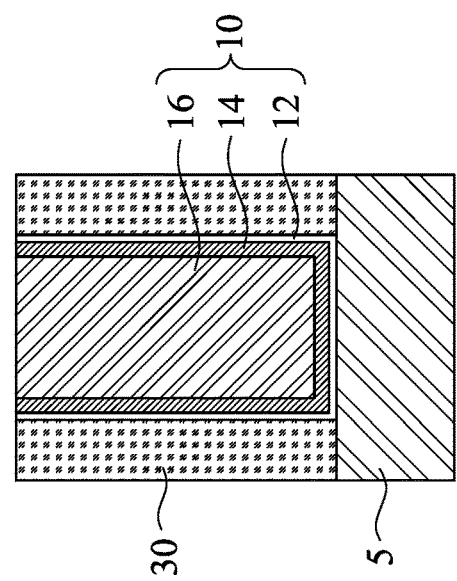

In some embodiments, no gate cap insulating layer is formed, as shown in FIG. 4D.

The material of the sidewall spacer 30, the material of the cap insulating layer 20, and a material of the ILD layer 40 are different from each other, so that each of these layers can be selectively etched. In one embodiment, the sidewall spacer 30 is made of SiOCN, SiCN or SiON, the cap insulating layer 20 is made of SiN, and the ILD 40 layer is made of $SiO_2$.

In this embodiment, fin field effect transistors (Fin FETs) fabricated by a gate-replacement process are employed.

FIG. 4E shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. After a planarization operation, the dummy gate structure is removed so as to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, so as to obtain the Fin FET structure shown in FIG. 4E. In FIG. 4E, parts of the metal gate structure 330, the cap isolation layer 340, sidewalls 330 and the ILD 370 are cut to show the underlying structure.

The metal gate structure 330, the cap isolation layer 340, sidewalls 330, source/drain 360 and the ILD 370 of FIG. 4E substantially correspond to the metal gate structures 10, cap insulating layers 20, sidewall spacers 30, source/drain regions 50 and interlayer dielectric layer (ILD) 40, of FIGS. 4A-4D, respectively. In some embodiments, one or more ILD layer is additionally formed over the ILD layer 40, thereby forming a first ILD layer 45 shown in FIGS. 5A-8C.

In the following explanation, as shown in FIGS. 5A-8C, four fin structures 5 are formed over a substrate 1, but the number of the fin structures 5 is not limited to four, and can be one, two, three or five or more.

After the metal gate structure is formed, a first etch stop layer 60 is formed over the first ILD layer 45 (or 40), and a second ILD layer 65 is formed over the first etch stop layer 60, as shown in FIG. 5A. The etch stop layer and the ILD layer are formed by suitable film formation methods, such as CVD, PVD or ALD.

By using one or more lithography and etching operations, a contact hole (opening) 67 for the first contact 70 is formed in the first and second ILD layers 45, 65, as shown in FIG. 5B.

Then, a first contact liner layer 68 is conformally formed in the contact hole 67 and on the upper surface of the second ILD layer 65, and a conductive material is formed over the first contact liner layer 68. The contact liner layer 68 and the conductive material layer are formed by suitable film formation methods, such as CVD, PVD, ALD or plating. Subsequently, a planarization operation, such as an etch back operation or a chemical mechanical polishing (CMP) operation, is performed to form the source/drain contact 70, as shown in FIG. 5C.

Subsequently, a second etch stop layer 75 and the third ILD layer 80 are formed, as shown in FIG. 5D. In some embodiments, the third ILD layer 80 includes, similar to the first dielectric layer 200, one or more layers of nitride-based insulating material. In some embodiments, the nitride-based insulating layer is nitride or oxynitride of silicon, germanium, or silicon germanide (SiGe). In some embodiments, the nitride-based insulating material includes silicon nitride and silicon oxynitride. In case of silicon oxynitride, the amount of nitrogen is greater than the amount of oxygen in some embodiments ($Si_xO_yN_z$, where y<z). In certain embodiments, silicon nitride is used as the third ILD layer 80.

As shown in FIG. 5E, by using one or more lithography and etching operations, a contact hole (opening) 82 for the second contact is formed in the third ILD layer 80 and the second etch stop layer 75.

Figure 6A:
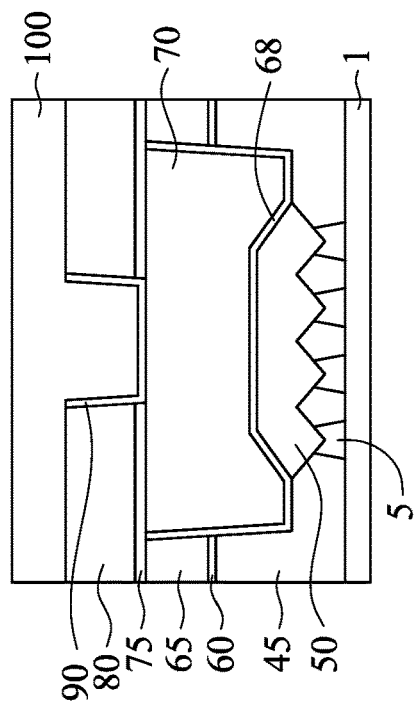
FIGS. 6A, 6B, 6C and 6D show cross sectional views of various stages of the sequential fabrication process of a semiconductor device according to an embodiment of the present disclosure.

Then, as shown in FIG. 6A, a second contact liner layer 90 is conformally formed in the contact hole 82. The second contact liner layer 90 is formed by suitable film formation methods, such as CVD, PVD, ALD or plating.

Figure 6B:
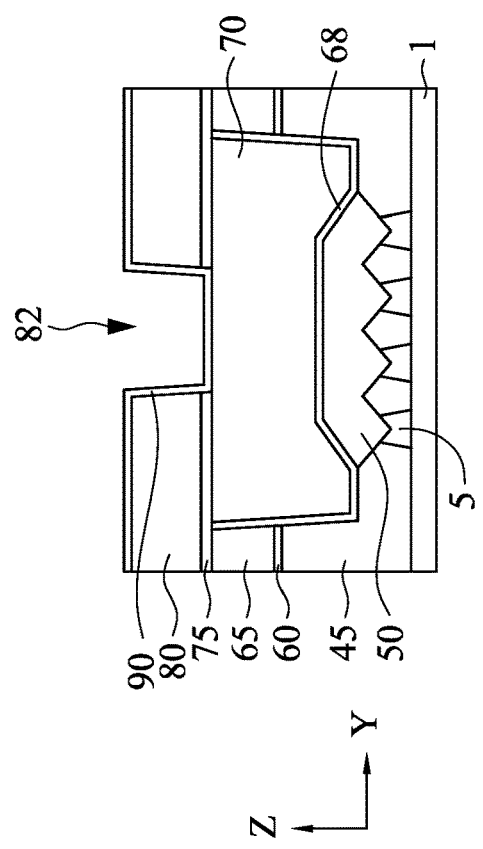
Figure 6C:
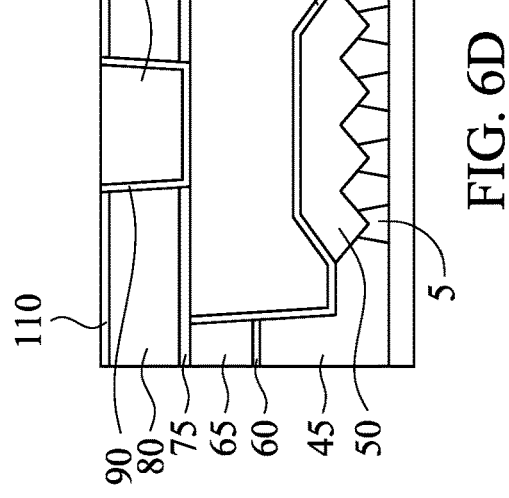

Then, as shown in FIG. 6B, one or more conductive material layers are formed in the contact hole 82 and the third ILD layer 80. The conductive layer is formed by suitable film formation methods, such as CVD, PVD, ALD or plating. In some embodiments, the conductive material is formed at a temperature in a range from about 200° C. to about 400° C. In some embodiments, the conductive material includes, similar to conductive pattern 225, polysilicon, aluminum, aluminum-silicon, titanium, titanium silicide, titanium nitride, tungsten, tungsten silicide, molybdenum, molybdenum silicide, copper, platinum, cobalt, cobalt silicide, tantalum, tantalum nitride, indium, gold, and silver or an alloy thereof. In certain embodiments, the conductive material includes tungsten. Then, a planarization operation, such as an etch back operation or a CMP operation, is performed to form the second contact 100, as shown in FIG. 6C.

Figure 6D:
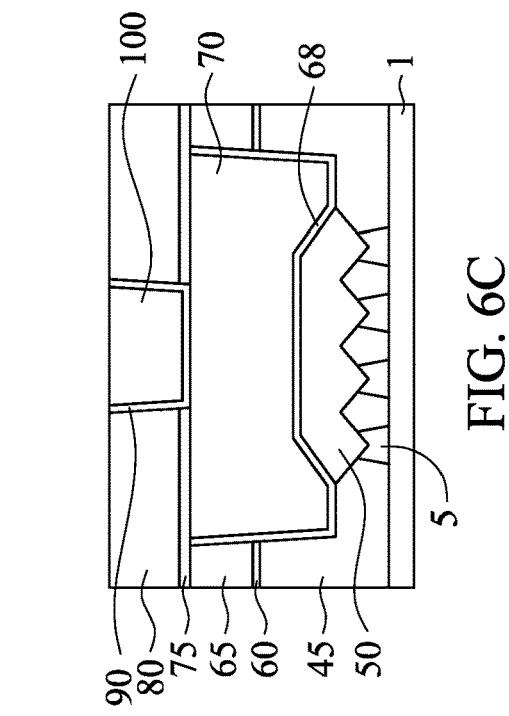

Subsequently, similar to FIGS. 1B, 2B and 3B, the surface of the third ILD layer is treated by an oxygen containing gas and/or an oxygen containing plasma to form an adhesion enhancement layer 110, as shown in FIG. 6D. In some embodiments, a deposition process is used to form the adhesion enhancement layer 110.

Figure 7A:
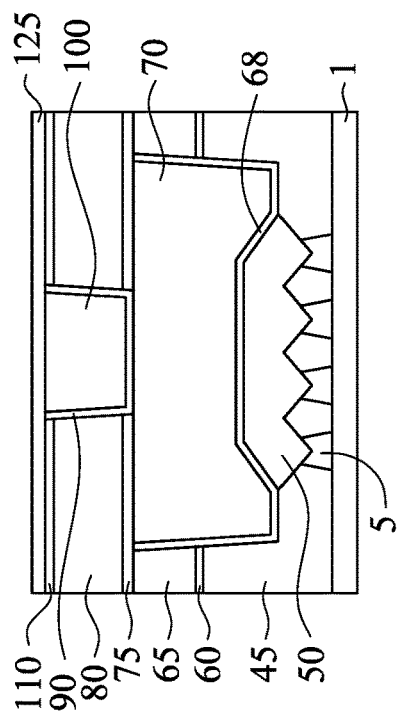
FIGS. 7A, 7B, 7C and 7D show cross sectional views of various stages of the sequential fabrication process of a semiconductor device according to an embodiment of the present disclosure.

Further, as shown in FIG. 7A, similar to FIGS. 1C, 2C and 3C, a third etch stop layer 120 is formed on the adhesion enhancement layer 110. In some embodiments, the third etch stop layer 120 includes, similar to the second dielectric layer 220, a nitride-based insulating material in some embodiments. In some embodiments, the third etch stop layer 120 includes an aluminum based insulating material. In certain embodiments, the third etch stop layer 120 includes aluminum nitride and/or aluminum oxynitride ($Al_xO_yN_z$). In case of aluminum oxynitride, the amount of nitrogen is greater than the amount of oxygen in some embodiments ($Al_xO_yN_z$, where y<z).

Figure 7B:
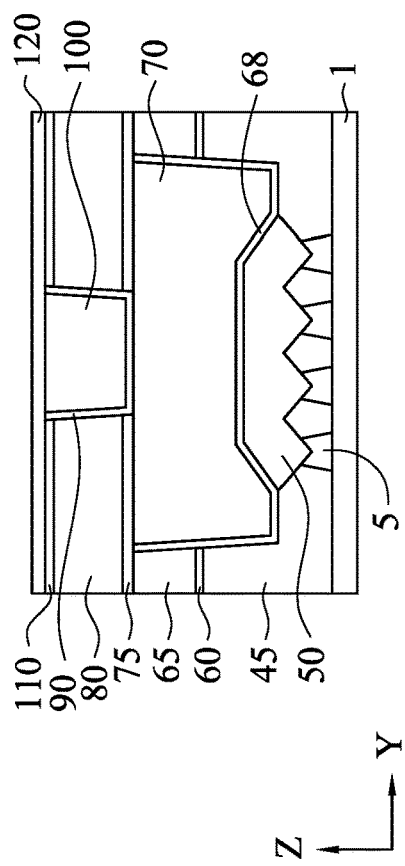

Then, as shown in FIG. 7B, similar to FIGS. 1D, 2D and 3D, the third etch stop layer 120 is oxidized into an oxidized etch stop layer 125. The structure and/or configuration of the oxidized third etch stop layer 125 is the same as or similar to those of the oxidized second dielectric layer 230 as set forth above.

Figure 7C:
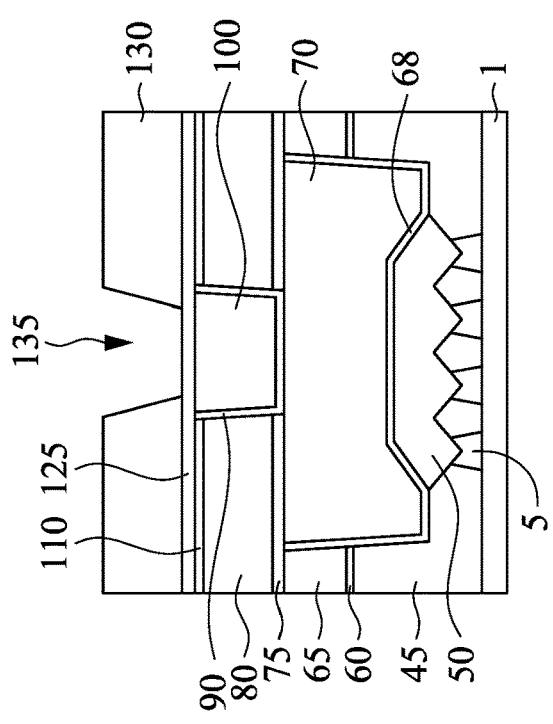

Subsequently, as shown in FIG. 7C, a fourth ILD layer 130 is formed over the oxidized etch stop layer 125. The material for the fourth ILD layer 130 includes one or more of silicon oxide, silicon nitride, SiOC, SiOCN, SiCN, SiON, a low-k material, or a porous material or any other suitable dielectric material. A low-k material generally has a dielectric constant smaller than silicon dioxide (3.9). In some embodiments, a low-k material has a dielectric constant smaller than 2.0.

Figure 7D:
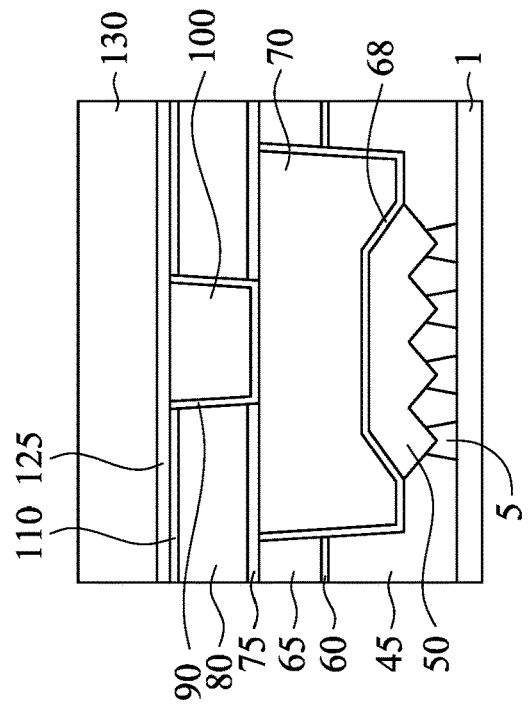

Then, as shown in FIG. 7D, by using one or more lithography and etching operations, a contact hole (opening) 135 for a third contact is formed in the fourth ILD layer 130. The etching stops at the oxidized etch stop layer 125 in some embodiments, as shown in FIG. 7D. Then, an additional etching operation is performed to remove the oxidized etch stop layer at the bottom of the opening 135, as shown in FIG. 8A.

Further, one or more conductive material layers are formed in the contact hole 135 and on the fourth ILD layer 130, and a planarization operation, such as an etch back operation or a CMP operation, is performed to form the third contact 140, as shown in FIG. 8B. In some embodiments, a third contact liner layer (not shown) is conformally formed in the contact hole 135. The conductive layers are formed by suitable film formation methods, such as CVD, PVD, ALD or plating. In some embodiments, the conductive material for the third contact and/or the third liner layer includes polysilicon, aluminum, aluminum-silicon, titanium, titanium silicide, titanium nitride, tungsten, tungsten silicide, molybdenum, molybdenum silicide, copper, platinum, cobalt, cobalt silicide, tantalum, tantalum nitride, indium, gold, and silver or an alloy thereof. When the bottom area of the third contact 140 is smaller than the top area of the second contact 100, a part of the oxidized etch stop layer 125 remains on the upper surface of the second contact 100.

In some embodiments, when the adhesion enhancement layer 110 is formed by a deposition method, the adhesion enhancement layer 110 is formed on the upper surface of the second contact 100. When the bottom area of the third contact 140 is smaller than the top area of the second contact 100, a part of the adhesion enhancement layer 110 remains on the upper surface of the second contact 100 as shown in FIG. 8C.

After forming the gate electrodes, further CMOS processes are performed to form various features such as additional interlayer dielectric layers, contacts/vias, interconnect metal layers, and passivation layers, etc.

Figure 9B:
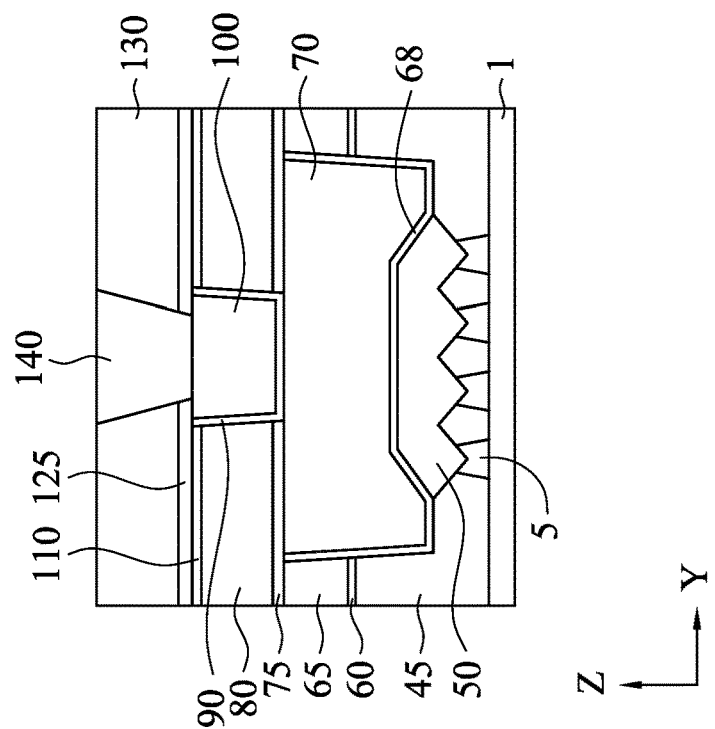
FIGS. 9A, 9B, 9C and 9D show various views of a semiconductor device according to an embodiment of the present disclosure.
Figure 9A:
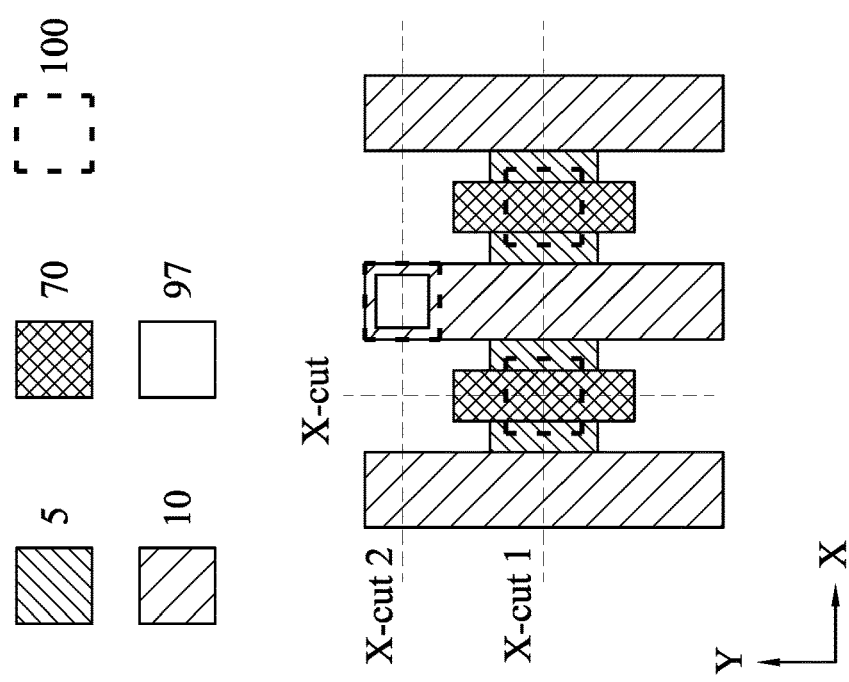
Figure 9D:
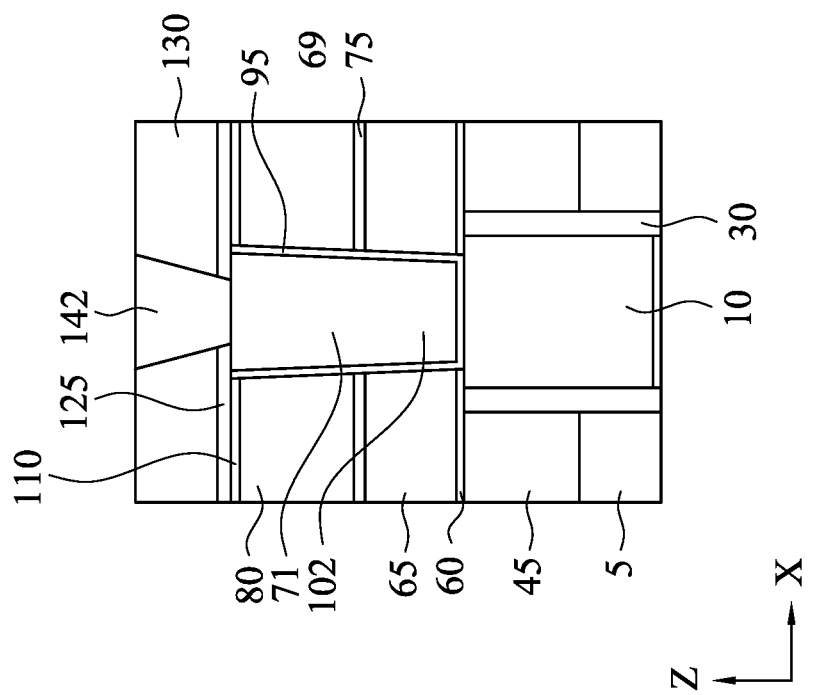
Figure 9C:
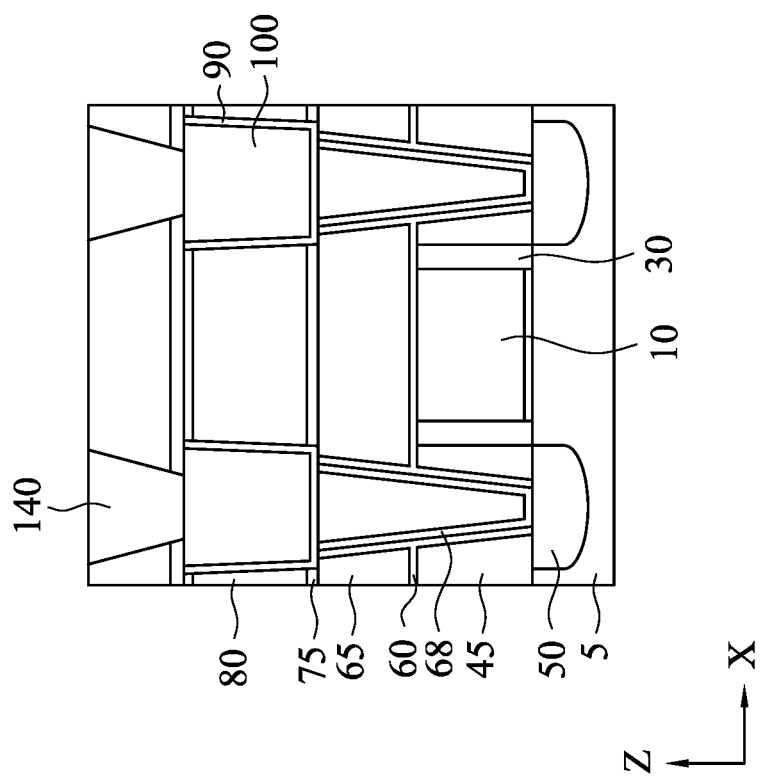

FIGS. 9A, 9B, 9C and 9D show various views of a semiconductor device according to an embodiment of the present disclosure. FIG. 9A is a plan view, FIG. 9B is a cross sectional view (Y-cut), FIG. 9C is a cross sectional view (X-cut 1) and FIG. 9D is a cross sectional view (X-cut 2). Materials, configurations, dimensions, processes and/or operations explained with respect to the foregoing embodiments can be employed in the following embodiments, and detailed explanation thereof may be omitted.

In FIG. 9A, three gate structures 10 extending in the Y direction are disposed over one fin structure 5 extending in the X direction. Portions between the gate structures 10 are source/drain regions 50, and source/drain contacts 70 are disposed over the source/drain regions 50. In some embodiments, the source/drain regions 50 include one or more epitaxially-formed semiconductor layers (epitaxial layers). In some embodiments, the source/drain contacts 70 are contact bars extending in the Y direction beyond the source/drain regions 50. Thus, a width of the source/drain epitaxial layer (source/drain region) 50 is smaller than a width of the contact bar 70 in the Y direction. As shown in FIGS. 9A and 9B, a width of the source/drain contact 70 is greater than a width of the upper contact 100 in the Y direction, in some embodiments. In some embodiments, one or more gate contacts 71 are disposed over one or more gate electrodes of the gate structures 10. Further, in some embodiments, upper contacts 100 and 102 are disposed over the source/drain contacts 70 and the gate contact 71, respectively.

As shown in FIGS. 9B-9D, the source/drain regions 50 are formed in recesses that are formed in the fin structure 5. The gate structure 10 includes a gate dielectric layer formed over the fin structure 5, a gate electrode and sidewall spacers 30. The gate structure 10 is embedded in a first interlayer dielectric (ILD) layer 45. The first ILD layer 45 includes one or more dielectric layers. In some embodiments, a first etch stop layer 60 is disposed over the first ILD layer 45, and a second ILD layer 65 is formed over the first etch stop layer 60. Further, a second etch stop layer 75 is disposed over the second ILD layer 65 and a third ILD layer 80 is formed over the second etch stop layer 75.

The first and second ILD layers 45, 65 include one or more layers of insulating material, for example, a silicon oxide based material, such as silicon dioxide ($SiO_2$), SiOC and SiOCN. In some embodiments, a low-k material or an organic material is used for the ILD layers. The third ILD layer 80 includes silicon nitride or nitrogen rich silicon oxynitride. The first and second etch stop layers 60, 75 are made of different material than the ILD layers and include one or more layers of insulating material, for example, silicon nitride based material, such as silicon nitride and SiON.

The first source/drain contact 70 is formed in a contact hole passing through the first and second ILD layers 45, 65 and the first and second etch stop layers 60, 75. In some embodiments, a first contact liner layer 68 is formed on the inner surface of the contact hole. In some embodiments, the first contact liner layer 68 includes one or more conductive material layers, such as Ti, TiN, Ta and TaN. In certain embodiments, a TiN layer is used as the first contact liner layer 68.

The first source/drain contact 70 and the gate contact 71 include one or more conductive material layers, such as W, Co, Ni, Mo and an alloy thereof. In certain embodiments, the first source/drain contact 70 and the gate contact 71 are made of Co.

In some embodiments, a second source/drain contact 100 is formed over the first source/drain contact 70. A first gate contact 102 is formed in a contact hole passing through the second and third ILD layers 65, 80 and the first and second etch stop layers 60, 75. The second source/drain contact 100 and the first gate contact 102 includes one or more conductive material layers, such as W, Co, Ni, Mo, Cu, Al and an alloy thereof. In certain embodiments, second source/drain contact 100 and the first gate contact 102 are made of W.

Further, an adhesion enhancement layer 110 and an oxidized etch stop layer 120 are disposed on the surface of the third ILD layer 80 as shown in FIGS. 9B-9D. A third source/drain contact 140 is disposed on the second source/drain contact 100 as shown in FIG. 9C, and a second gate contact 142 is disposed on the first gate contact 102 as shown in FIG. 9D.

In the present disclosure, an adhesion enhancement layer is formed between a silicon nitride based dielectric layer and aluminum nitride based dielectric layer, and therefore it is possible to suppress peeling off of the aluminum nitride based dielectric layer during and after oxidation of the aluminum nitride based dielectric material layer.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first dielectric layer is formed over a substrate, an adhesion enhancement layer is formed on a surface of the first dielectric layer, and a second dielectric layer is formed on the adhesion enhancement layer. In one or more of the foregoing and the following embodiments, the first dielectric layer is made of silicon nitride, and the second dielectric layer is made of aluminum nitride. In one or more of the foregoing and the following embodiments, the adhesion enhancement layer is made of silicon oxide. In one or more of the foregoing and the following embodiments, the second dielectric layer is oxidized. In one or more of the foregoing and the following embodiments, the adhesion enhancement layer is formed by treating the surface of the first dielectric layer with an oxygen containing gas. In one or more of the foregoing and the following embodiments, the oxygen containing gas includes at least one selected from the group consisting of $N_2O$, $O_2$, ozone and $CO_2$. In one or more of the foregoing and the following embodiments, wherein during the treating the surface of the first dielectric layer with the oxygen containing gas, the substrate is heated at a temperature in a range from 250° C. to 400° C., and the oxygen containing gas is applied at a pressure in a range from 0.5 Torr to 20 Torr. In one or more of the foregoing and the following embodiments, a thickness of the adhesion enhancement layer is in a range from 1 nm to 5 nm. In one or more of the foregoing and the following embodiments, the adhesion enhancement layer is formed by treating the surface of the first dielectric layer with oxygen containing plasma. In one or more of the foregoing and the following embodiments, the adhesion enhancement layer is formed by a deposition method.

In accordance with another aspect of the present disclosure, in a method of manufacturing a semiconductor device, a first nitride-based dielectric layer is formed over a semiconductor device structure on a substrate, an adhesion enhancement layer is formed over the first nitride-based dielectric layer, a second nitride-based dielectric layer is formed over the adhesion enhancement layer, and the second nitride-based dielectric layer is at least partially oxidized. The first nitride-based dielectric layer is made of a different material than the second nitride-based dielectric layer. In one or more of the foregoing and the following embodiments, a conductive pattern is formed in the first nitride-based dielectric layer, and an upper surface of the conductive pattern is exposed from the first nitride-based dielectric layer. In one or more of the foregoing and the following embodiments, the conductive pattern includes tungsten. In one or more of the foregoing and the following embodiments, the adhesion enhancement layer is formed on the upper surface of the conductive pattern. In one or more of the foregoing and the following embodiments, the adhesion enhancement layer is formed on the first nitride-based dielectric layer and not on the upper surface of the conductive pattern. In one or more of the foregoing and the following embodiments, the first nitride-based dielectric layer is made of silicon nitride, and the second nitride-based dielectric layer is made of aluminum nitride.

In accordance with another aspect of the present disclosure, in a method of manufacturing a semiconductor device, a first conductive contact embedded in a first insulating layer is formed, a second insulating layer is formed over the first conductive contact, a first opening is formed in the second insulating layer to at least partially expose the first conductive contact, the first opening is filled by a first conductive material to form a second conductive contact in contact with the first conductive contact, an adhesion enhancement layer is formed on the second insulating layer, a nitride-based insulating layer is formed on the adhesion enhancement layer, the nitride-based insulating layer is oxidized, a third insulating layer is formed on the oxidized nitride-based insulating layer, a second opening is formed by etching the third insulating layer, the oxidized nitride-based insulating layer is removed, and the second opening is filled by a second conductive material. In one or more of the foregoing and the following embodiments, the second insulating layer is made of silicon nitride, and the nitride-based insulating layer is made of aluminum nitride. In one or more of the foregoing and the following embodiments, the first conductive contact is formed on a source/drain epitaxial layer. In one or more of the foregoing and the following embodiments, the first conductive contact is formed on a gate electrode.

In accordance with one aspect of the present disclosure, a semiconductor device includes a first dielectric layer disposed over a semiconductor device structure, an adhesion enhancement layer disposed over the first dielectric layer, and a second dielectric layer disposed over the adhesion enhancement layer. The first metal nitride layer and the second metal nitride layer comprise different metals. In one or more of the foregoing and the following embodiments, the first dielectric layer is made of silicon nitride. In one or more of the foregoing and the following embodiments, the second dielectric layer is made of aluminum oxynitride. In one or more of the foregoing and the following embodiments, the second dielectric layer includes an aluminum oxynitride layer on an aluminum nitride layer. In one or more of the foregoing and the following embodiments, the adhesion enhancement layer is made of $SiO_x$, where $0<x<2$. In one or more of the foregoing and the following embodiments, the adhesion enhancement layer has a thickness of 0.5 nm to 10 nm.

In accordance with another aspect of the present disclosure, a semiconductor device includes a first nitride-based dielectric layer disposed over a semiconductor device structure, a first conductive pattern formed in the first nitride-based dielectric layer, an adhesion enhancement layer disposed over the first nitride-based dielectric layer, a second nitride-based dielectric layer disposed over the adhesion enhancement layer, a third dielectric layer disposed over the second nitride-based dielectric layer, and a second conductive pattern formed in the third dielectric layer in contact with the first conducive pattern. In one or more of the foregoing and the following embodiments, the first nitride-based dielectric layer is made of silicon nitride, and the second nitride-based dielectric layer includes at least one of an aluminum nitride layer and an aluminum oxynitride layer. In one or more of the foregoing and the following embodiments, the first conductive pattern includes tungsten. In one or more of the foregoing and the following embodiments, the first conductive pattern is formed on a contact that is in contact with a source/drain epitaxial layer. In one or more of the foregoing and the following embodiments, the first conductive pattern is formed on a contact that is in contact with a gate electrode. In one or more of the foregoing and the following embodiments, the third dielectric includes a low-k dielectric material. In one or more of the foregoing and the following embodiments, the second nitride-based dielectric layer partially covers an upper surface of the first conductive pattern. In one or more of the foregoing and the following embodiments, the adhesion enhancement layer partially covers an upper surface of the first conductive pattern, and the second nitride-based dielectric layer is not in contact with an upper surface of the first conductive pattern.

In accordance another aspect of the present disclosure, a semiconductor device includes a gate electrode, a source/drain structure, a first conductive contact disposed in an first interlayer dielectric layer (ILD) and contacting the source/drain structure, a second conductive contact contacting the first conductive contact and disposed in an opening formed in a second ILD layer disposed over the first ILD layer, a gate contact contacting the gate electrode and disposed in the first and second ILD layers, an adhesion insulating layer disposed over the second ILD layer, an etch stop layer disposed on the adhesion insulating layer, a third ILD layer disposed over the etch stop layer, and a third conductive contact contacting either the second conductive contact or the gate contact and disposed in the third ILD layer. In one or more of the foregoing and the following embodiments, the adhesion insulating layer has a higher oxygen concentration than the second ILD layer. In one or more of the foregoing and the following embodiments, the etch stop layer contains aluminum. In one or more of the foregoing and the following embodiments, the semiconductor device further includes a fourth conductive contact disposed in the third ILD layer. The third conductive contact contacts the second conductive contact, and the fourth conductive contact contacts the gate contact. In one or more of the foregoing and the following embodiments, the second conductive contact and the gate contact include tungsten. In one or more of the foregoing and the following embodiments, a thickness of the adhesion insulating layer is in a range from 1 nm to 5 nm, and a thickness of the etch stop layer is greater than the thickness of the adhesion insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first dielectric layer disposed over a semiconductor device structure;
an adhesion enhancement layer disposed over the first dielectric layer and in contact with a surface of the first dielectric layer; and
a second dielectric layer disposed over the adhesion enhancement layer,
wherein the first dielectric layer and the second dielectric layer comprise different metals.

2. The semiconductor device of claim 1, wherein the first dielectric layer is made of silicon nitride.

3. The semiconductor device of claim 1, wherein the second dielectric layer is made of aluminum oxynitride.

4. The semiconductor device of claim 1, wherein the second dielectric layer includes an aluminum oxynitride layer on an aluminum nitride layer.

5. The semiconductor device of claim 1, wherein the adhesion enhancement layer is made of $SiO_x$, where $0<x<2$.

6. The semiconductor device of claim 1, wherein the adhesion enhancement layer has a thickness of 0.5 nm to 10 nm.

7. A semiconductor device, comprising:
a first nitride-based dielectric layer disposed over a semiconductor device structure;
a first conductive pattern formed in the first nitride-based dielectric layer;
an adhesion enhancement layer disposed over the first nitride-based dielectric layer and in contact with a surface of the first nitride-based dielectric layer;
a second nitride-based dielectric layer disposed over the adhesion enhancement layer;
a third dielectric layer disposed over the second nitride-based dielectric layer; and
a second conductive pattern formed in the third dielectric layer in contact with the first conductive pattern.

8. The semiconductor device of claim 7, wherein
the first nitride-based dielectric layer is made of silicon nitride, and
the second nitride-based dielectric layer includes at least one of an aluminum nitride layer and an aluminum oxynitride layer.

9. The semiconductor device of claim 7, wherein the first conductive pattern includes tungsten.

10. The semiconductor device of claim 9, wherein the first conductive pattern is formed on a contact that is in contact with a source/drain epitaxial layer.

11. The semiconductor device of claim 9, wherein the first conductive pattern is formed on a contact that is in contact with a gate electrode.

12. The semiconductor device of claim 7, wherein the third dielectric layer includes a low-k dielectric material.

13. The semiconductor device of claim 7, wherein the second nitride-based dielectric layer partially covers an upper surface of the first conductive pattern.

14. The semiconductor device of claim 7, wherein:
the adhesion enhancement layer partially covers an upper surface of the first conductive pattern, and
the second nitride-based dielectric layer is not in contact with an upper surface of the first conductive pattern.

15. A semiconductor device comprising:
a gate electrode;
a source/drain structure;
a first conductive contact disposed in a first interlayer dielectric layer (ILD) and contacting the source/drain structure;
a second conductive contact contacting the first conductive contact and disposed in an opening formed in a second ILD layer disposed over the first ILD layer;
a gate contact contacting the gate electrode and disposed in the first and second ILD layers;
an adhesion insulating layer disposed over the second ILD layer and formed in contact with a surface of the second ILD layer;
an etch stop layer disposed on the adhesion insulating layer;
a third ILD layer disposed over the etch stop layer; and
a third conductive contact contacting either the second conductive contact or the gate contact and disposed in the third ILD layer.

16. The semiconductor device of claim 15, wherein the adhesion insulating layer has a higher oxygen concentration than the second ILD layer.

17. The semiconductor device of claim 15, wherein the etch stop layer contains aluminum.

18. The semiconductor device of claim 15, further comprising a fourth conductive contact disposed in the third ILD layer, wherein the third conductive contact contacts the second conductive contact, and the fourth conductive contact contacts the gate contact.

19. The semiconductor device of claim 15, wherein the second conductive contact and the gate contact include tungsten.

20. The semiconductor device of claim 15, wherein:
a thickness of the adhesion insulating layer is in a range from 1 nm to 5 nm, and
a thickness of the etch stop layer is greater than the thickness of the adhesion insulating layer.

* * * * *